(12) United States Patent
Keupp et al.

(10) Patent No.: US 11,474,182 B2
(45) Date of Patent: Oct. 18, 2022

(54) MOTION DETECTION IN CEST MAGNETIC RESONANCE IMAGING BASED ON Z-SPECTRUM ANALYSIS

(71) Applicant: KONINKLIJKE PHILIPS N.V., Eindhoven (NL)

(72) Inventors: Jochen Keupp, Rosengarten (DE); Elwin De Weerdt, Tilburg (NL)

(73) Assignee: Koninklijke Philips N.V., Eindhoven (NL)

(*) Notice: Subject to any disclaimer, the term of this patent is extended or adjusted under 35 U.S.C. 154(b) by 52 days.

(21) Appl. No.: 17/059,280

(22) PCT Filed: May 22, 2019

(86) PCT No.: PCT/EP2019/063169
§ 371 (c)(1),
(2) Date: Nov. 27, 2020

(87) PCT Pub. No.: WO2019/228878
PCT Pub. Date: Dec. 5, 2019

(65) Prior Publication Data
US 2021/0215782 A1    Jul. 15, 2021

(30) Foreign Application Priority Data

May 29, 2018 (EP) .................................. 18174766

(51) Int. Cl.
*G01R 33/565* (2006.01)
*G01R 33/56* (2006.01)

(52) U.S. Cl.
CPC ... *G01R 33/56509* (2013.01); *G01R 33/5605* (2013.01); *G01R 33/5608* (2013.01)

(58) Field of Classification Search
None
See application file for complete search history.

(56) References Cited

U.S. PATENT DOCUMENTS

| 10,175,332 B2 | 1/2019 | Keupp |
| 2013/0009640 A1 | 1/2013 | Fautz et al. |
| 2020/0072931 A1* | 3/2020 | Zaiss ................ G06N 20/10 |

OTHER PUBLICATIONS

Zaiss et al "Chemical Exchange Saturation Transfer and MR Z Spectroscopy In Vivo" Phys. Med. Biol. 58 (2013) p. 221-269.
(Continued)

*Primary Examiner* — Rodney E Fuller

(57) ABSTRACT

A medical imaging system includes a memory for storing machine executable instructions. The medical imaging system further includes a processor for controlling the medical imaging system. Execution of the machine executable instructions causes the processor to: receive magnetic resonance image data acquired according to a CEST magnetic resonance imaging protocol, wherein the magnetic resonance image data includes voxels, wherein each of the voxels includes a measured Z-spectrum for a set of saturation frequency offsets; assign a motion likelihood map to each voxel by comparing the measured Z-spectrum of each voxel to predetermined criteria; and reconstruct a CEST magnetic resonance image using the magnetic resonance image data and the motion likelihood map.

20 Claims, 13 Drawing Sheets

(56) References Cited

OTHER PUBLICATIONS

Nicolas Geades et al., "Quantitative analysis of the z-spectrum using a numerically simulated look-up table: Application to the healthy human brain at 7T" Magnetic Resonance in Medicine 78 p. 645-655 (2017).

Yi Zhang et al., "Selecting the Reference Image for Registration of CEST series" J Magn Reson Imaging. Mar. 2016 ; 43(3): 756-761 doi:10.1002/jmri.25027.

Kyle M. Jones et al.,Respiration gating and Bloch fitting improve pH measurements with acidoCEST MRI in an ovarian orthotopic tumor model Proc. SPIE 9788,Medical Imaging 2016: Biomedical Applications in Molecular, Structural, and Functional Imaging, 978815 (Mar. 29, 2016); doi: 10.1117/12.2216418.

Zhengwei Zhou et al., "Optimized CEST cardiovascular magnetic resonance for assessment of metabolic activity in the heart" Journal of Cariovascular Magnetic Resonance (2017).

Chen Shu-Zh0ng et al: "Chemical exchange saturation transfer (CEST) MR technique for in-vivo liver imaging at 3.0 tesla", European Radiology, Springer International, Berlin, DE, vol. 26, No. 6, Sep. 3, 2015 (Sep. 3, 2015), pp. 1792-1800.

Mehrabian Hatef et al: "Glioblastoma (GBM) effects on quantitative MRI of contralateral normal appearing white matter", Journal of Neuro-Oncology, Kluwer, Boston.US,vol. 139, No. 1,Mar. 28, 2018 (Mar. 28, 2018), pp. 97-106.

Jochen Keupp et al.: "Motion Correction based on Z-spectral Consistency for APTw/CESTw MRI Applications in Body Oncology", Proceedings of the International Society for Magnetic Resonance in Medicine, ISMRM, Joint Annual Meeting ISMRM-ESMRMB, Paris,France, Jun. 16-21, 2018, No. 4113, Jun. 1, 2018 (Jun. 1, 2018).

Zaiss Moritz et al: "Possible artifacts in dynamic CEST MRI due to motion and field alterations". Journal of Magnetic Resonance, vol. 298, Nov. 13, 2018 (Nov. 13, 2018), pp. 16-22.

Peter C.M. Van Zijl et al: "Magnetization Transfer Contrast and Chemical Exchange Saturation Transfer MRI. Features and analysis of the field-dependent saturation spectrum", NeuroImage, vol. 16 8, Apr. 21, 2017 (Apr. 21, 2017),pp. 222-241.

Nirbhay N. Yadav et al.: "Retrospective motion correction in CEST MRI data using time domain analysis".Proceedings of the International Society for Magnetic Resonance in Medicine, ISMRM, 23rd Annual Meeting and Exhibition, Toronto, Ontario, Canada, May 30-Jun. 5, 2015, No. 175 2, May 15, 2015.

Tobias Wech et al.: "Robust image registration in CEST-acquisitions by exploiting a low-rank plus sparse decomposition of the Z-spectrum", Proceedings of the International Society for Magnetic Resonance in Medicine, ISMRM, 25th Annual Meeting and Exhibition, Honolulu, HI, USA, Apr. 22-Apr. 27, 2017, No. 376 7, Apr. 7, 2017.

Search Report and Written Opinion From PCT/EP2019/063169 dated Sep. 2, 2019.

\* cited by examiner

MOTION DETECTION IN CEST MAGNETIC RESONANCE IMAGING BASED ON Z-SPECTRUM ANALYSIS

CROSS REFERENCE TO RELATED APPLICATIONS

This application is a U.S. national phase application of International Application No. PCT/EP2019/063169 filed on May 22, 2019, which claims the benefit of EP Application Serial No. 18174766.8 filed on May 29, 2018 and is incorporated herein by reference.

FIELD OF THE INVENTION

The invention relates to Magnetic Resonance Imaging (MRI), in particular to Chemical Exchange Saturation Transfer (CEST) MRI

BACKGROUND OF THE INVENTION

Magnetic resonance imaging (MRI) scanners rely on a large static magnetic field ($B_0$) to align the nuclear spins of atoms as part of the procedure for producing images within the body of a patient. These images can reflect various quantities or properties of the subject. For example, the density of hydrogen protons can be measured and resolved spatially. However, often times a compound or metabolite is so dilute that as a practical matter it is not possible to image it directly.

Therefore, techniques such as chemical exchange saturation transfer (CEST) MRI have been developed. In CEST imaging, the presence of dilute metabolites with exchangeable protons is measured. The protons of the metabolites which can be studied using CEST are able to exchange positions with the protons from water. A saturation pulse can be used to suppress the MRI signal from the exchangeable protons of the metabolites. Because the protons are exchangeable, they trade places with the water protons. Because the protons from the metabolites were targeted with a saturation pulse they do not contribute to the measured MRI signal for a period of time. This is true even when the protons from the metabolites were exchanged with the water protons. This then has the effect of reducing the measured MRI signal from the water protons. By performing saturation pulses at different frequency offsets and measuring the effect on the measured MRI signal information about the presence of dilute metabolites or other substances can be determined. There are a variety of techniques that are related to the CEST technique. One example is amide proton transfer (APT) MRI.

The journal article Zaiss et al. "Chemical exchange saturation transfer (CEST) and MR Z-spectroscopy in vivo: a review of theoretical approaches and methods," Phys. Med. Biol. 58 (2013) R221-R269, provides a topical review of CEST and Z-spectroscopy.

European patent application publication EP 2 515 138 A1 discloses a method of MR imaging of a moving portion of a body, the method comprising the steps of: detecting a motion signal (MS) from the body while continuously subjecting the portion of the body to one or more preparation RF pulses; subjecting the portion of the body to an imaging sequence comprising at least one excitation RF pulse and switched magnetic field gradients, wherein the imaging sequence is triggered by the detected motion signal (MS); acquiring MR signals from the portion of the body; and reconstructing a MR image from the acquired MR signals

SUMMARY OF THE INVENTION

The invention provides for a medical imaging system, a computer program product, and a method in the independent claims. Embodiments are given in the dependent claims.

A difficulty in performing CEST is that is that magnetic resonance images for a number of different saturation frequencies are acquired. The slice or volume of the subject is therefore imaged multiple times. If the subject moves during this acquisition the resulting z-spectrum can be corrupted. Embodiments of the invention may provide for a means of reducing the effect of this motion by assigning a motion likelihood map to each voxel. That is, the motion probability map represents a voxel-wise probability of motion. The motion likelihood map could for example be a mask which indicates that motion is above a particular threshold or it could be related to or derived from a probability that data within that voxel has been corrupted. The motion likelihood map is then additionally used in the reconstruction of the CEST magnetic resonance image. That is, correction of motion artefacts on the basis of the motion likelihood map is included in the reconstruction.

The present invention pertains to motion correction in CEST-MR imaging. The CEST-imaging technique aims at detection of dilute metabolites and relies on the chemical exchange between protons of the metabolite and bulk water protons. These metabolites may be detected on the basis of details of the so-called z-spectrum that is acquired by scanning the RF frequency of the saturation pulse and computing for each voxel the water-proton spectrum normalised to its main (bulk water) peak. An insight of the present invention is that deviations of the z-spectrum beyond experimental accuracy appear to represent motion affecting the CEST-signal. That is, voxels for which the z-spectrum deviates substantially from the ideal spectral values are likely to have been affected by motion. The predetermined range of variations beyond which deviations may be attributed to motion may be dependent on the details of the applied CEST-imaging protocol. This predetermined range may be determined by way of simple calibration or trial-and-error. A further insight is that when the likelihood of motion is taken into account in the reconstruction, the diagnostic image quality of the CEST-MR image is improved, even if motion is not certain and not precisely qualified in the suspect voxels.

In one aspect the invention provides for a medical imaging system that comprises a memory for storing machine-executable instructions. The medical imaging system further comprises a processor for controlling the medical imaging system. Execution of the machine-executable instructions causes the processor to receive magnetic resonance image data according to a CEST magnetic resonance imaging protocol. The magnetic resonance image data comprises voxels. Each of the voxels comprises a measured z-spectrum for a set of saturation frequency offsets. Execution of the machine-executable instructions further causes the processor to assign a motion likelihood map to each voxel by comparing the measured z-spectrum of each voxel to a predetermined criteria.

Execution of the machine-executable instructions further causes the processor to reconstruct a CEST magnetic resonance image using the magnetic resonance image data and the motion likelihood map. The acquisition of the CEST magnetic resonance image data may take several minutes. It is possible that during the acquisition the subject may move. Embodiments may therefore provide for a means of reducing the effects of motion on the CEST magnetic resonance images. The z-spectrum for each voxel itself is compared to the predetermined criteria. This is used to assign a motion likelihood map. The reconstruction of the CEST magnetic resonance image is then used using the magnetic resonance image data in addition to the motion likelihood map. For example the motion likelihood map may be used to eliminate data which is likely motion corrected or even to rescale the data.

Typical CEST magnetic resonance imaging protocols comprise a set of at least seven different measurements that are made at different saturation frequency offsets. Although seven measurements are typical the magnetic resonance image data may have more or fewer than the seven measurements.

The CEST magnetic resonance imaging protocol may be any of a variety of different CEST protocols. For example APTw amide proton transfer-weighted CEST is one example. Other examples include CEST imaging for oncology, neurology (+neuro oncology) and neuro-vascular (stroke) applications. CEST imaging of other proton pools like hydroxyl or amine CEST is also possible or CEST imaging of CEST contrast agents (paraCEST or diaCEST agents) can also be performed. Dynamic glucose enhanced CEST imaging, e.g. GlucoCEST or GlycoCEST, may also be improved by application of an embodiment.

In another embodiment execution of the machine-executable instructions further causes the processor to fit a curve to at least a subset of the measured z-spectrum for each of the voxels by minimizing an error function. The motion likelihood map is dependent upon the minimized error function for each of the voxels. This embodiment may be beneficial because the curve fitting may provide for an effective means of determining if the z-spectrum is corrupted by motion.

The curve that may be fit to the Z-spectrum may be one of a variety of different curves. For example the Voigt function, multiple gauss functions, and the Lorentz-gauss function may all find applicability.

In another embodiment the saturation frequency offset of the measured Z-spectrum within a predetermined chemical-shift distance of predetermined proton pools for saturation transfer are excluded from the fitting of the measured Z-spectrum. When performing the CEST magnetic resonance imaging protocol, there may be resonances at predetermined frequencies due to protons that can be transferred via the CEST affect. These will result in a dip in the measured Z-spectrum. In this embodiment these predetermined frequencies may be emitted from the curve fitting. This may improve how well the fit to the curve is a measure of the motion as detected by the Z-spectrum.

In another embodiment the memory contains a Z-spectrum dictionary comprising multiple Z-spectra. For example, the Z-spectrum dictionary may comprise entries for different tissue types that may be within a subject. Execution of the machine-executable instructions further cause the processor to construct a fitted Z-spectrum using a linear combination of the multiple Z-spectra by optimizing a set of weights. A motion likelihood map for each voxel is calculated using a residual deviations of the measured Z-spectrum from the linear combination of dictionary entries. The actual measured Z-spectra for a voxel may be a combination of different Z-spectra due to different types of tissues or materials within the voxel. The Z-spectrum dictionary may comprise entries for all of these different possible tissue types or materials. If the measured Z-spectra differs from the Z-spectra that was reconstructed by linear combination then it may be an indication that the Z-spectra is corrupted. This may then be used for detecting motion.

The Z-spectrum dictionary may be constructed from measured and/or calculated Z-spectra. The optimization of the set of weights may be performed in a variety of different ways. In one example the least squared method is used to optimize the set of weights. In other examples other optimization techniques may be used.

In another embodiment the motion likelihood map is constructed by comparing the measured Z-spectrum for one or more of the frequency offsets to the predetermined criteria.

In another embodiment the predetermined criteria is an absolute range of Z-spectral signals of the measured Z-spectrum in percent of an unsaturated Z-spectral signal of the measured Z-spectrum.

In another embodiment the predetermined criteria is a relative range in comparison of the Z-spectral signals to adjacent Z-spectral signals of the measured Z-spectrum.

In another embodiment the predetermined criteria is a task to see if the Z-spectral signals monotonically increasing for adjacent Z-spectral signals of the measured Z-spectrum as an absolutely distance of frequency offset. This may be 0 ppm.

In another embodiment the predetermined criteria is that the Z-spectral signal is found outside of a predetermined error margin in relation to a model function.

The identification of the Z-spectral signal outside of a predetermined error margin may be identification of a Z-spectral signal as being an outlier. The model function may for example be obtained by fitting a function or by doing dictionary-based modeling.

In another embodiment the likelihood map is a probability distribution map.

In another embodiment execution of the machine-executable instructions further causes the processor to scale voxels of the CEST magnetic resonance image using the likelihood map. This embodiment may be beneficial because it may be used to de-emphasize voxels which are likely corrupted due to motion. This may for example be equivalent to down-scaling the signal in voxels which have a suspected large motion effect.

In another embodiment execution of the machine-executable instructions further causes the processor to construct an image mask by thresholding the motion likelihood map. Execution of the machine-executable instructions further causes the processor to modify the CEST magnetic resonance image by setting its voxels to a predetermined value using the image mask. In this embodiment if the motion likelihood map is above a particular value which may be determined by thresholding then these voxels are excluded or set to a predetermined value using the mask.

In another embodiment execution of the machine-executable instructions further causes the processor to render the CEST magnetic resonance image on a display. Execution of the machine-executable instructions further causes the processor to render the motion likelihood map adjacent to the CEST magnetic resonance image or superimpose the CEST magnetic resonance image on the display. This embodiment may be beneficial because the CEST magnetic resonance image displayed with the motion likelihood map may be a useful tool for someone trying to interpret the CEST magnetic resonance image. The motion likelihood map may provide a degree of confidence in how accurate various values of the CEST magnetic resonance image are.

In another embodiment execution of the machine-executable instructions further causes the processor to receive magnetic resonance k-space data. Execution of the machine-executable instructions further causes the processor to reconstruct the magnetic resonance image data using the magnetic resonance k-space data according to the CEST magnetic resonance imaging protocol.

In another embodiment the medical imaging system further comprises a magnetic resonance imaging system configured for acquiring the magnetic resonance k-space data from a subject within an imaging zone. The memory further stores pulse sequence commands. The pulse sequence commands are configured to acquire the magnetic resonance data according to the CEST magnetic resonance imaging protocol. Execution of the machine-executable instructions causes the processor to control the magnetic resonance imaging system with the pulse sequence commands to acquire the magnetic resonance k-space data.

In another aspect the invention provides for a computer program product comprising machine-executable instructions for execution by a processor controlling a medical imaging system. Execution of the machine-executable instructions causes the processor to receive magnetic resonance image data acquired according to a CEST magnetic resonance imaging protocol. The magnetic resonance image data comprises voxels. Each of the voxels comprises a measured Z-spectrum for a set of saturation frequency offsets. Execution of the machine-executable instructions further causes the processor to assign a motion likelihood map to each voxel by comparing the measured Z-spectrum of each voxel to a predetermined criteria. Execution of the machine-executable instructions further causes the processor to reconstruct a CEST magnetic resonance image using the magnetic resonance image data and the motion likelihood map.

In another embodiment the medical imaging system further comprises a magnetic resonance imaging system configured for acquiring magnetic resonance k-space data from a subject within an imaging zone. The memory further stores pulse sequence commands. The pulse sequence commands are configured to control the magnetic resonance imaging system to acquire the magnetic resonance data according to the CEST magnetic resonance imaging protocol. Execution of the machine-executable instructions causes the processor to control the magnetic resonance imaging system with the pulse sequence commands to acquire the magnetic resonance k-space data. Execution of the machine-executable instructions further causes the processor to reconstruct the magnetic resonance image data using the magnetic resonance k-space data according to the CEST magnetic resonance imaging protocol.

In another aspect the invention further provides for a medical system. The method comprises receiving magnetic resonance image data acquired according to a CEST magnetic resonance imaging protocol. The magnetic resonance image data comprises voxels. Each of the voxels comprises a measured Z-spectrum for a set of saturation frequency offsets. The method further comprises assigning a motion likelihood map to each voxel by comparing the measured Z-spectrum of each voxel to a predetermined criteria. The method further comprises reconstructing a CEST magnetic resonance image using the magnetic resonance image data and the motion likelihood map.

It is understood that one or more of the aforementioned embodiments of the invention may be combined as long as the combined embodiments are not mutually exclusive.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a 'circuit,' 'module' or 'system'. Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, random access memory (RAM), read only memory (ROM), an optical disk, a magneto-optical disk, and the register file of the processor. Examples of optical disks include compact disks (CD) and digital versatile disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising a 'processor' should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object-oriented programming language such as Java, Smalltalk, C++ or the like and conventional procedural programming languages, such as C or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the internet using an internet service provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE 488 port, Bluetooth connection, wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, a tactile electronic display, a Braille screen, a cathode ray tube (CRT), a storage tube, a bi-stable display, an electronic paper, a vector display, a flat panel display, a vacuum fluorescent display (VF), light-emitting diode (LED) displays, an electroluminescent display (ELD), plasma display panels (PDP), a liquid crystal display (LCD), organic light-emitting diode displays (OLED), a projector, and a head-mounted display.

Magnetic Resonance k-space data is defined herein as being the recorded measurements of radio frequency signals emitted by atomic spins using the antenna of a magnetic resonance apparatus during an MRI scan. Magnetic resonance image data is defined herein as being the reconstructed two or three dimensional visualization of anatomic data that is reconstructed from the magnetic resonance k-space data. Visualization of the magnetic resonance image data can be performed using a computer. The water signal may be referred to as complex water signal herein and is interchangeable with when the water signal is part of or comprises a complex image or complex image data. The fat signal may be referred to as complex fat signal herein and is interchangeable with when the fat signal is part of or comprises a complex image or complex image data.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
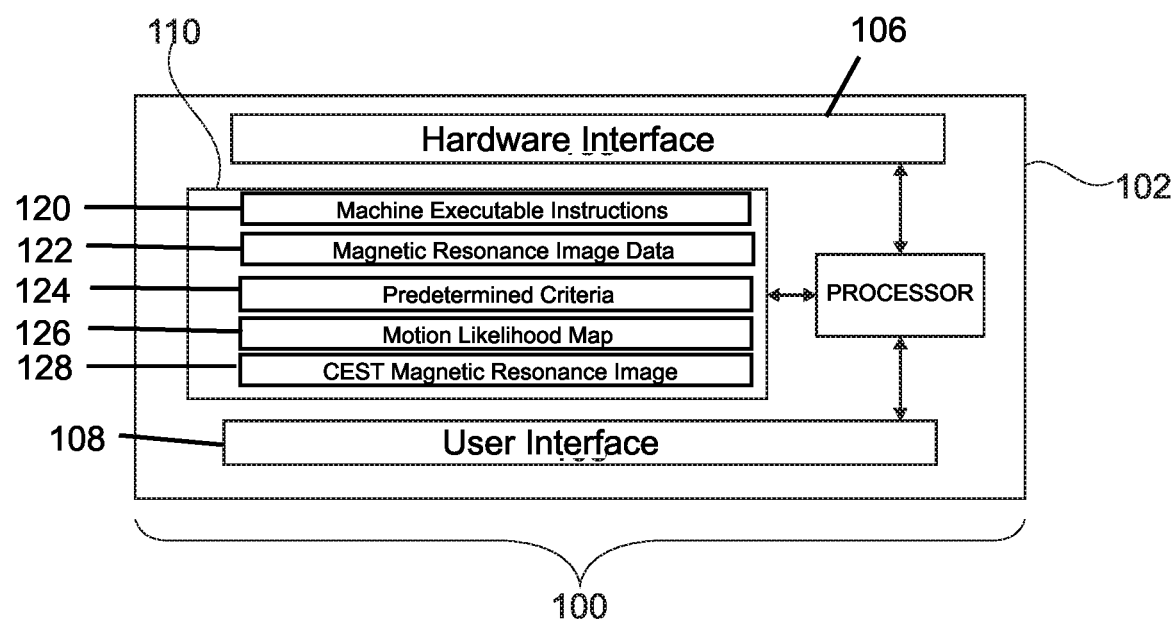
FIG. 1 illustrates an example of a medical imaging system.

FIG. 1 illustrates an example of a medical imaging system 100. The medical imaging system 100 is shown as comprising a computer 102 that comprises a processor 104. The processor is shown as being connected to an optional hardware interface 106, and an optional user interface 108. The hardware interface 106 may for example by a network interface or it may also be used for exchanging data or commands with other components of the medical imaging system. The processor 104 is further shown as being connected to a memory 110. The memory 110 may be any combination of memory which is accessible to the processor 104. This may include such things as main memory, cached memory, and also non-volatile memory such as flash RAM, hard drives, or other storage devices. In some examples the memory 104 may be considered to be a non-transitory computer-readable medium.

The memory is shown as containing machine-executable instructions 120. The machine-executable instructions 120 enable the processor 104 to perform various data processing tasks and also in some examples to control other components of the medical imaging system 100. The memory 110 is further shown as containing magnetic resonance image data 122. The magnetic resonance image data 122 comprises voxels. Each voxel comprises a measured Z-spectrum for a set of saturation frequency offsets. The memory 110 is further shown as containing a predetermined criteria 124. The predetermined criteria 124 can be compared to the magnetic resonance image data 122 to generate or calculate a motion likelihood map 126. The motion likelihood map 126 is shown as being stored in the memory 110. The memory 110 is further shown as containing a CEST magnetic resonance image 128 that was reconstructed from the magnetic resonance image data 122 at least partially using the motion likelihood map 126.

Figure 2:
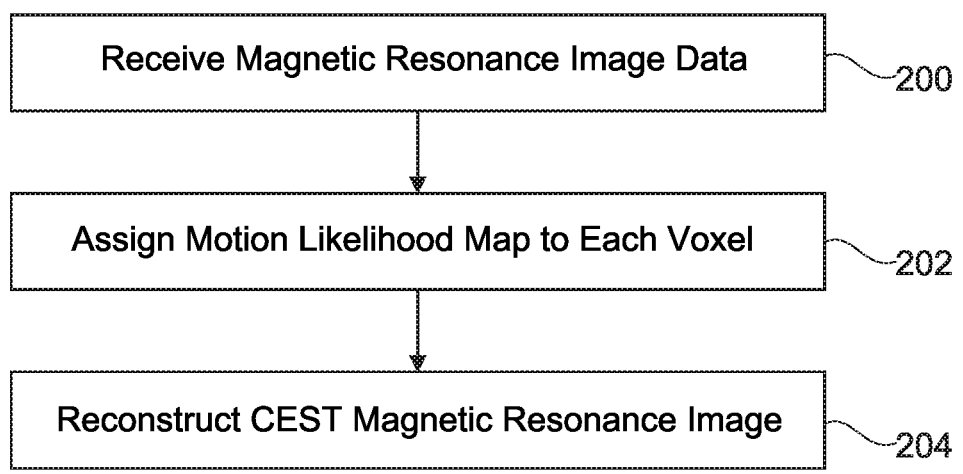
FIG. 2 shows a flow chart which illustrates a method of operating the medical imaging system of FIG. 1.

FIG. 2 shows a flowchart which illustrates a method of operating the medical imaging system 100 of FIG. 1. First in step 200 the magnetic resonance image data 122 is received. The magnetic resonance image data is acquired according to a CEST magnetic resonance imaging protocol. The magnetic resonance image data comprises voxels and each of the voxels comprises a measured Z-spectrum for a set of saturation frequency offsets. Next in step 202 the motion likelihood map 126 is assigned to each voxel by comparing the measured Z-spectrum of each voxel to the predetermined criteria 124. Finally in step 204 the CEST magnetic resonance image 128 is reconstructed using the magnetic resonance image data 122 and the motion likelihood map 126.

Figure 3:
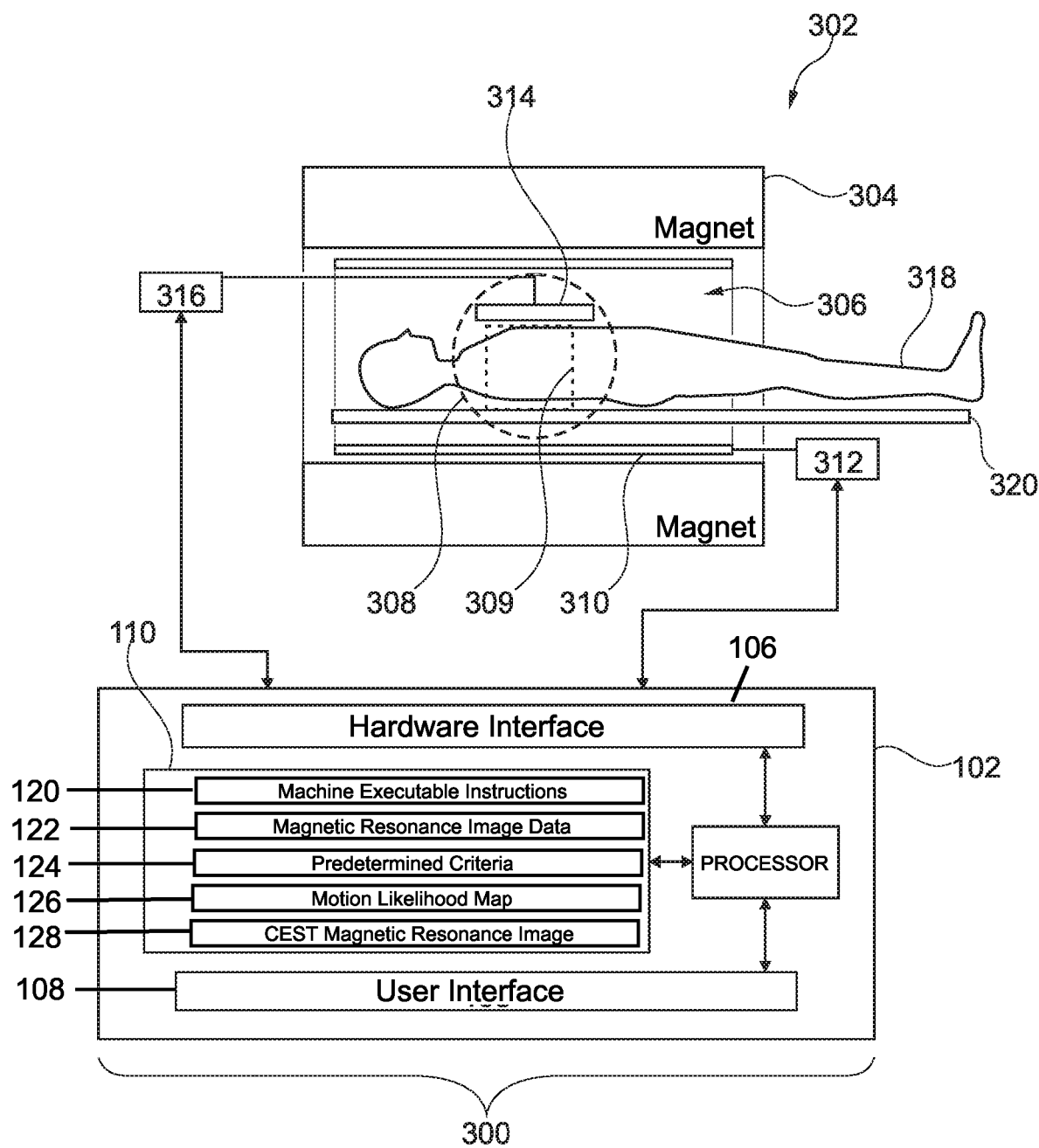
FIG. 3 illustrates a further example of a medical imaging system.

FIG. 3 illustrates a further example of a medical imaging system 300. The medical imaging system 300 in FIG. 3 is similar to the medical imaging system 100 in FIG. 1 except that the medical imaging system 300 further comprises a magnetic resonance imaging system 302. The magnetic resonance imaging system 302 comprises a magnet 304. The magnet 304 is a superconducting cylindrical type magnet with a bore 306 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 306 of the cylindrical magnet 304 there is an imaging zone 308 where the magnetic field is strong and uniform enough to perform magnetic resonance imaging. A region of interest 309 is shown within the imaging zone 308. The magnetic resonance data that is acquired typically acquired for the region of interest. A subject 318 is shown as being supported by a subject support 320 such that at least a portion of the subject 318 is within the imaging zone 308 and the region of interest 309.

Within the bore 306 of the magnet there is also a set of magnetic field gradient coils 310 which is used for acquisition of preliminary magnetic resonance data to spatially encode magnetic spins within the imaging zone 308 of the magnet 304. The magnetic field gradient coils 310 connected to a magnetic field gradient coil power supply 312. The magnetic field gradient coils 310 are intended to be representative. Typically magnetic field gradient coils 310 contain three separate sets of coils for spatially encoding in three orthogonal spatial directions. A magnetic field gradient power supply supplies current to the magnetic field gradient coils. The current supplied to the magnetic field gradient coils 310 is controlled as a function of time and may be ramped or pulsed.

Adjacent to the imaging zone 308 is a radio-frequency coil 314 for manipulating the orientations of magnetic spins within the imaging zone 308 and for receiving radio transmissions from spins also within the imaging zone 308. The radio frequency antenna may contain multiple coil elements. The radio frequency antenna may also be referred to as a channel or antenna. The radio-frequency coil 314 is connected to a radio frequency transceiver 316. The radio-frequency coil 314 and radio frequency transceiver 316 may be replaced by separate transmit and receive coils and a separate transmitter and receiver. It is understood that the radio-frequency coil 314 and the radio frequency transceiver 316 are representative. The radio-frequency coil 314 is intended to also represent a dedicated transmit antenna and a dedicated receive antenna. Likewise the transceiver 316 may also represent a separate transmitter and receivers. The radio-frequency coil 314 may also have multiple receive/transmit elements and the radio frequency transceiver 316 may have multiple receive/transmit channels. For example if a parallel imaging technique such as SENSE is performed, the radio-frequency could 314 will have multiple coil elements.

The transceiver 316 and the gradient controller 312 are shown as being connected to the hardware interface 106 of the computer system 101.

The memory is further shown as containing pulse sequence commands 321. The pulse sequence commands are configured for controlling the magnetic resonance imaging system 302 to acquire the magnetic resonance k-space data according to a CEST magnetic resonance imaging protocol. The memory 110 is shown as containing magnetic resonance k-space data 322 that was acquired using the pulse sequence commands 321. The motion likelihood map may be assigned or calculated in a variety of different ways. The memory 110 is shown as optionally containing a curve 324 and an error function 326. The curve 324 may be fit to a measured Z-spectrum. The error function 326 may be the error function or fitting parameter of the curve 324 to a measured Z-spectrum. The error function 326 may be used in assigning the motion likelihood map.

The memory 110 is optionally shown as containing a Z-spectrum dictionary 328. The Z-spectrum dictionary 328 is a collection of different Z-spectra that may be for different materials or tissue that are expected to be within the subject 318. The Z-spectrum dictionary 328 can be used to fit a linear combination of Z-spectra to the measured Z-spectra. This may result in a set of weights 330 that are calculated during this optimization process. The difference between the fitted Z-spectrum and the measured may be expressed as a residual 332. The residual 332 may be used to calculate the motion likelihood map.

Figure 4:
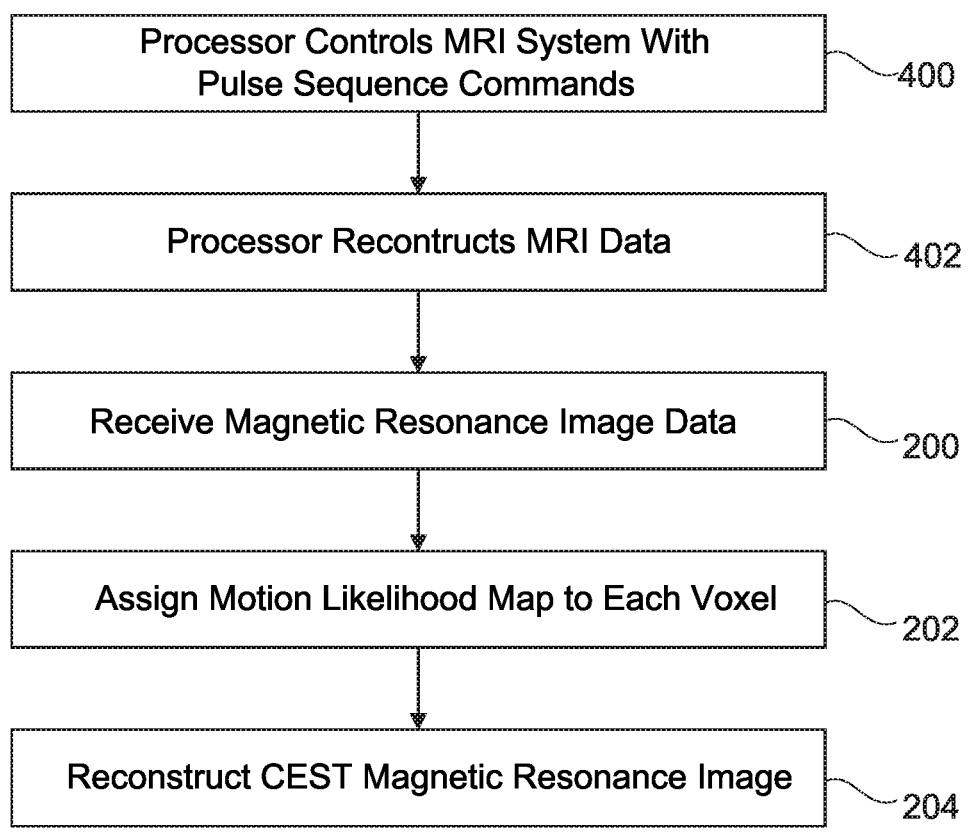
FIG. 4 shows a flow chart which illustrates a method of operating the medical imaging system of FIG. 3.

FIG. 4 shows a flowchart which illustrates a method of operating the medical imaging system 300 of FIG. 3. The method in FIG. 4 is similar to the method illustrated in FIG. 2. In FIG. 4 the method starts in step 400. In step 400 the processor controls the magnetic resonance imaging system 302 with the pulse sequence commands 321 to acquire the magnetic resonance k-space data 322. This may be equivalent to receiving the magnetic resonance k-space data. Next in step 402 the processor reconstructs the magnetic resonance image data 122 using the magnetic resonance k-space data 322. This is done according to the CEST magnetic resonance imaging protocol. The method then proceeds on to step 200 which is identical to step 200 as illustrated in FIG. 2. Likewise, steps 202 and 204 are also performed.

As was mentioned above, CEST imaging in body areas with significant physiological motion is strongly hampered because of the inherent motion sensitivity of this MRI technique. In particular, slow physiological motion in the abdomen, e.g. peristaltic motion or bladder filling may lead to Z-spectral inconsistency and artifacts in CEST images. Here, a method is disclosed which analyses Z-spectral consistency to mask CEST image areas affected by motion.

Chemical Exchange Saturation Transfer (CEST) MRI and specifically Amide Proton Transfer weighted (APTw) MRI has gained a lot of attention for applications like tumor grading in oncology. CEST imaging in body areas with significant physiological motion is strongly hampered because of the inherent motion sensitivity of this MRI technique. Motion artifacts in APTw/CEST MRI can manifest themselves in multiple different ways. For signal encoding, spatial and Z-spectral dimensions, relating to the RF saturation frequency offset, are sampled. This typically require scan times in the order of 3-5 minutes at least. As a reference, this acquisition time is e.g. achievable when using RF saturation of 2 seconds, 10 slices, spatial matrix 128, 7 different Z-spectral points for B0-field correction and normalization (S) and including parallel imaging acceleration (acceleration factor 2) with 3D fast spin echo technique. There are plenty of physiological motion effects happening in body imaging over this time period. Individual volumes recorded for one Z-spectral point may be motion corrupted (fast motion/pulsation/short term involuntary motion), common for all MRI is scanning. For CEST imaging in particular, motion between different Z-spectral points may lead to artifacts, because the processing implies subtraction and division of different Z-spectral data. On the relevant time scales (e.g. 1 minute per Z-spectral volume in 3D imaging), slow relocations, position drifts ("body sinking into cushion") may play a role. In particular, slow physiological motion in the abdomen, e.g. peristaltic motion or bladder filling may lead to Z-spectral inconsistency and artifacts in CEST images. These typically lead to translational motion but also to elastic deformation of organs. Here, a method is disclosed which analyzes Z-spectral consistency to efficiently mask CEST image areas affected by motion.

Examples may address a shortcoming of all CEST MRI which is the large sensitivity to any motion between the acquisitions of different Z spectral image volumes. The corresponding CEST specific motion artifacts may be largely suppressed by examples, without the need to acquire extra data points for motion detection or correction.

Some examples may use Z-spectral features for a consistency check in order to mask CEST images in case of signal corruption by physiological motion. The Z-spectrum $S[\omega]$, if not corrupted, should basically always show increasing image intensity with increasing offset. Also, the shape of the Z-spectrum, specific for an imaging parameter choice and a nominal tissue type will be similar. Thus, actual relative Z-spectral intensities at different saturation frequency offsets $\omega$ may be compared with the expectation. If there are significant deviations found from the expected Z-spectral shape, it is assumed that the CEST acquisition was corrupted by motion. Thus, the corresponding voxel may be disregarded, masked or downscaled to suppress CEST specific motion artifacts.

The Z spectrum may be acquired with any type of MRI sequence and RF saturation scheme. The order of Z spectral frequency acquisition may be arbitrary. It could be beneficial in some cases to sort the Z spectral acquisition in relation according to the type of motion expected, e.g. alternating or linear acquisitions in the Z-spectral dimension depending on slow or fast motion regimes, respectively.

Relating to various examples, 3 basic types of Z-spectral analysis are proposed below, based on a dataset of N Z spectral images, to detect and correct CEST motion artifacts:
(1) Specify ranges for selected Z spectral signals $S[\omega i]/S_0$ that may be absolute ranges in percent of the unsaturated image $S_0$ (510). Or relative ranges as compared to an adjacent Z spectral signal $S[\omega_j]/S_0$
   a. Check for ranges: $p1[\%] < S[\omega_i]/S_0 < p2[\%]$ (
   b. Check for increasing signal with increasing frequency offsets $S[\omega_i] > S[\omega_j](|\omega_i| > |\omega_j|)$.
   c. Check for bounds in adjacent signal relations: $\alpha < S[\omega_i]/S[\omega_j] < \beta$ Any observed deviation from the range criteria are classified as motion artifacts. Please refer to 526 in FIG. 5 below. In practice values of $\alpha=1.1$ to 1.3 and $\beta=1.5$ to 2 have worked well (2) Fit a signal model to a selected range of points k<N and check the deviation of the measured Z-spectral images from the fitted model curve: $S[\omega_i]/S_{model-fit}[\omega_i] < p[\%]$. The model may be for example a Lorentz-Gauss function. Larger deviations indicate motion. Please refer to FIG. 7 below.

(3) Create a dictionary of possible Z-spectral shapes related to known tissue types. Allow linear combinations of different tissue type related Z-spectral shapes for partial volume effects. Check consistency of the measured Z-spectral shape with any combination of the Z-spectral dictionary. If a match cannot be found, or if the match is poor it may be assumed that a motion error exists in the currently processed voxel.

Examples may also provide several ways to apply corrections in case that a voxel shows suspicious signal in terms of motion inconsistency according to one of the above criteria.
(i) A probability of motion corruption may be assigned to each voxel according to the above consistency criteria.
(ii) The probability map of motion artifacts may be used to
   a. Mask the CEST image
   b. Downscale areas with suspect motion
   c. Display the probability map as overlay or next to the CEST image as confidence information As an example, intensities at two selected Z-spectral offset frequencies are compared at $\omega 1$ and $\omega 2$ and reject voxels, which do not full fulfill the criteria
$\alpha < S[\omega 1]/S[\omega 2] < \beta$, as illustrated in FIG. 5.

Figure 5:
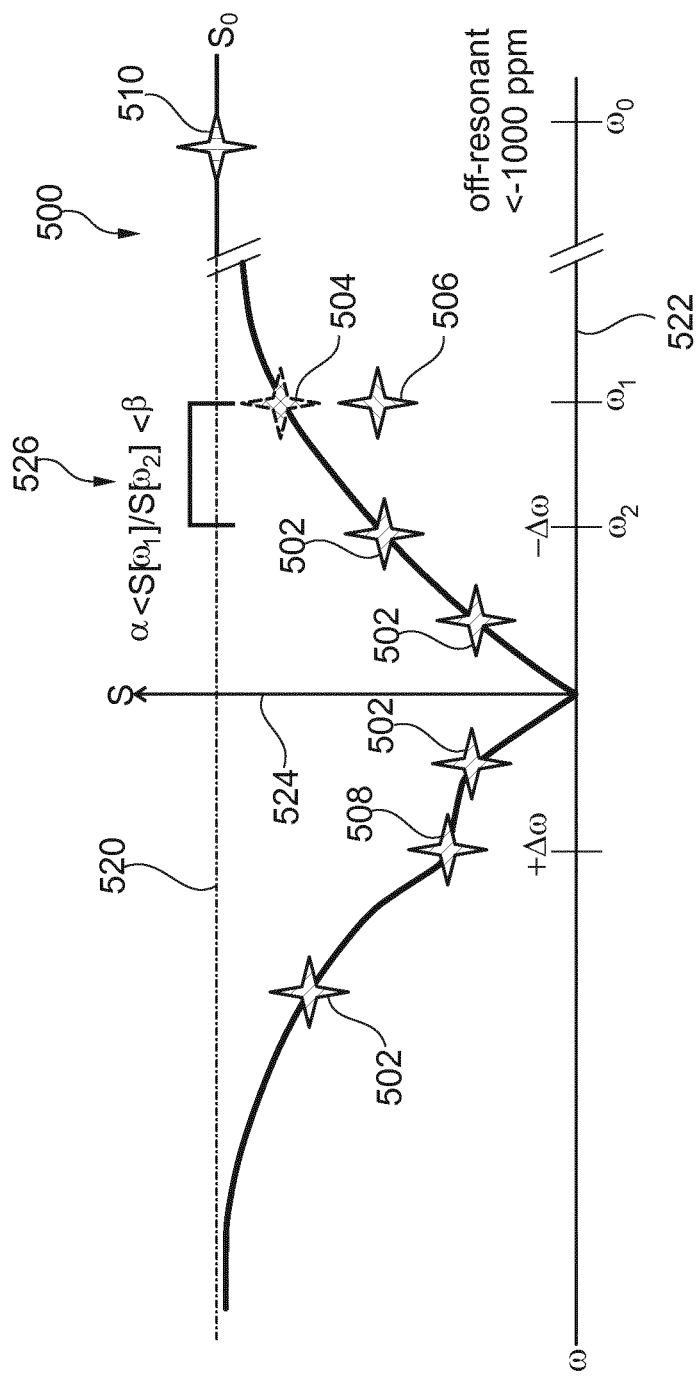
FIG. 5 illustrates an example of a Z-spectrum.

FIG. 5 illustrates an example of a Z-spectrum 500. The Z-spectrum 500 is constructed from several different Z-spectral points 502. The Z-spectral point labeled 504 is a Z-spectral point where there is an expected measurement location. However, the actual Z-spectral point 506 has been corrupted by motion. The Z-spectral point 508 corresponds to a Z-spectral point at a position affected by the CEST effect. The Z-spectral point 510 is an off resonant Z-spectral point which is used to measure the magnitude 520 of the signal without a magnetization transfer pulse. The off resonant Z-spectral point 510 is measured at the order of about 1000 ppm off resonant. The x-axis is the resonance in ppm 522 in comparison to the water resonance of hydrogen. The y-axis 524 is the signal magnitude.

FIG. 5 also shows a predetermined criteria 526 that can be used for detecting motion. The ratio of the signal of 506 to the adjacent signal 502 is seen if it is within two predetermined limits alpha and beta. If the ratio of the magnitudes at 506 to 502 is not within this predetermined range then it may indicate that there is motion corruption of the data.

FIG. 5: Exemplary embodiment: Z-spectral consistency check using two selected frequencies $\omega 1$ and $\omega 2$ and a criterion tuned to the expected Z-spectral shape, using threshold values for intensity changes $\alpha$ and $\beta$. The shape and adequate threshold values will depend on CEST parameter choices but can be fixed for a given (standardized) CEST protocol.

Figure 6:
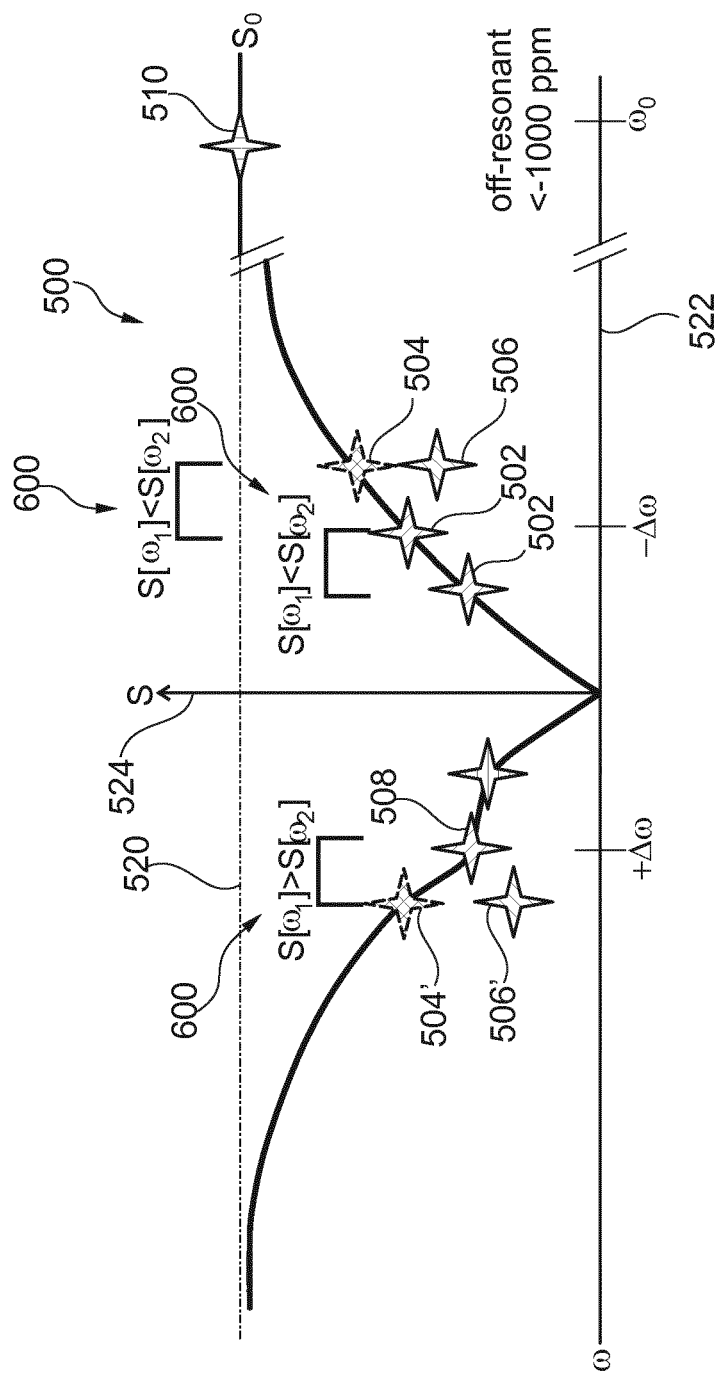
FIG. 6 illustrates a further example of a Z-spectrum.

FIG. 6 illustrates another example of a Z-spectrum 500. In this example there are two Z-spectral points which are corrupted by motion 506 and 506'. They are displaced from their expected positions at 504 and 504' respectively. In this example it is the predetermined criteria 600 it is checked that the Z-spectral points are monotonically increasing as the absolute value of the distance from the water resonance 324 increases. It can be seen that this predetermined criteria can be used to identify that 506 and 506' are likely motion corrupted. This may be used to assign the motion likelihood map 126.

Figure 7:
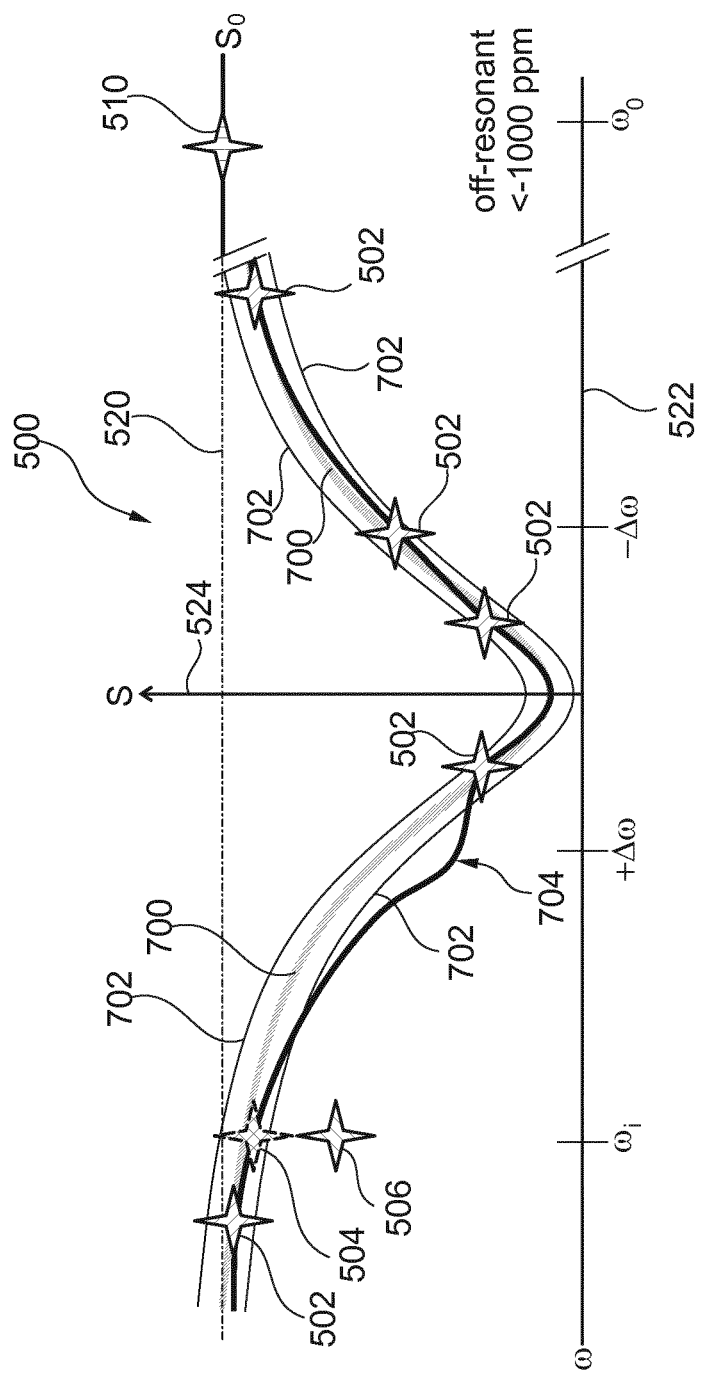
FIG. 7 illustrates a further example of a Z-spectrum.

FIG. 7 illustrates a further example of a Z-spectrum 500. In this example a model function 700 has been fit to the Z-spectral points 502, 504 and 510. The model function 700 is used to define a predefined error margin 702 around the model function 700. It can be seen that the Z-spectral point 506 is not within the predefined error margin 702. The Z-spectral point 506 is likely due to motion. It can be seen that there is a dip 704 in the actual Z-spectrum curve due to a CEST dip. This point was excluded from the fitting of the model function 700. This prevented the dip 704 due to the CEST effect from disturbing the location of the model function 700.

In FIG. 7, the Z-spectral consistency check is made using multiple Z spectral frequencies $\omega_i$. The actually measured Z spectrum is compared to a (fitted) model including error margins. A typical model for a Z-spectral background (MT effect) is a Lorentz-Gauss function, as in the example above. The shape and adequate threshold values will depend on CEST parameter choices but can be fixed for a given (standardized) CEST protocol. Saturation frequencies near the proton pool of interest (here: amides, $+\Delta\omega=3.5$ ppm) may be excluded from the consistency check, because here variation are expected because of the CEST contrast.

FIG. 8-13 shows examples of a liver MRI CEST examination corrected using the proposed Z-spectral method. In this demonstration, a 3T MRI system (Achieva Tex., Philips, NL), equipped with 32 element Torso-Cardiac coil reception, a respiratory belt for triggering, and 2-channel parallel transmission was used. RF saturation at 100% duty cycle was applied using transmission channel alternation.

Further parameters: FOV 220×500 mm; in-plane resolution 1.8 mm; coronal slices 6 mm; reconstruction 0.86 mm; 2D fast spin-echo with driven equilibrium refocusing; 4 segments with shot duration of 440 ms; low high k-space order; $\Delta\omega=+3.5$ ppm (APTw); trigger delay 810 ms; extra delay after the acquisition window 1.6 s; 19 Z-spectral points; step size 0.4 ppm; scan duration 7 1/2 min; TR/TE=5700/6.2 ms; scan time per Z-spectral point 23 s; pixel bandwidth 290 Hz; RF saturation B=1.5 µT and 2 seconds duration. For this specific CEST sequence, $\alpha=1.3$ was chosen and $\beta=1.6$ is a good choice to detect motion via inconsistency of Z-spectral data further using $\omega_1=-580$ Hz and $\omega_2=-380$ Hz.

In FIGS. 8 through 13 an example of masking of inconsistent Z-spectral data in CEST MRI. (FIG. 8) $S[\omega 1]$; (FIG. 9) $S[\omega 1]$; (FIG. 10) Quotient $S[\omega 1]/S[\omega 2]$ shows motion problems within the liver, although the diaphragm position is rather stable using a respiratory trigger. (FIG. 11) Result of asymmetry analysis ($MTR_{asym}$) with B0 field correction at $\Delta\omega=+3.5$ ppm (APTw imaging). (FIG. 12) Mask based on Z-spectral consistency at $\omega 1/\omega 2$. (FIG. 13) $MTR_{asym}$ masked for Z-spectral inconsistency (masked values set to 0%), called $MTR_{asym}$.

Figure 8:
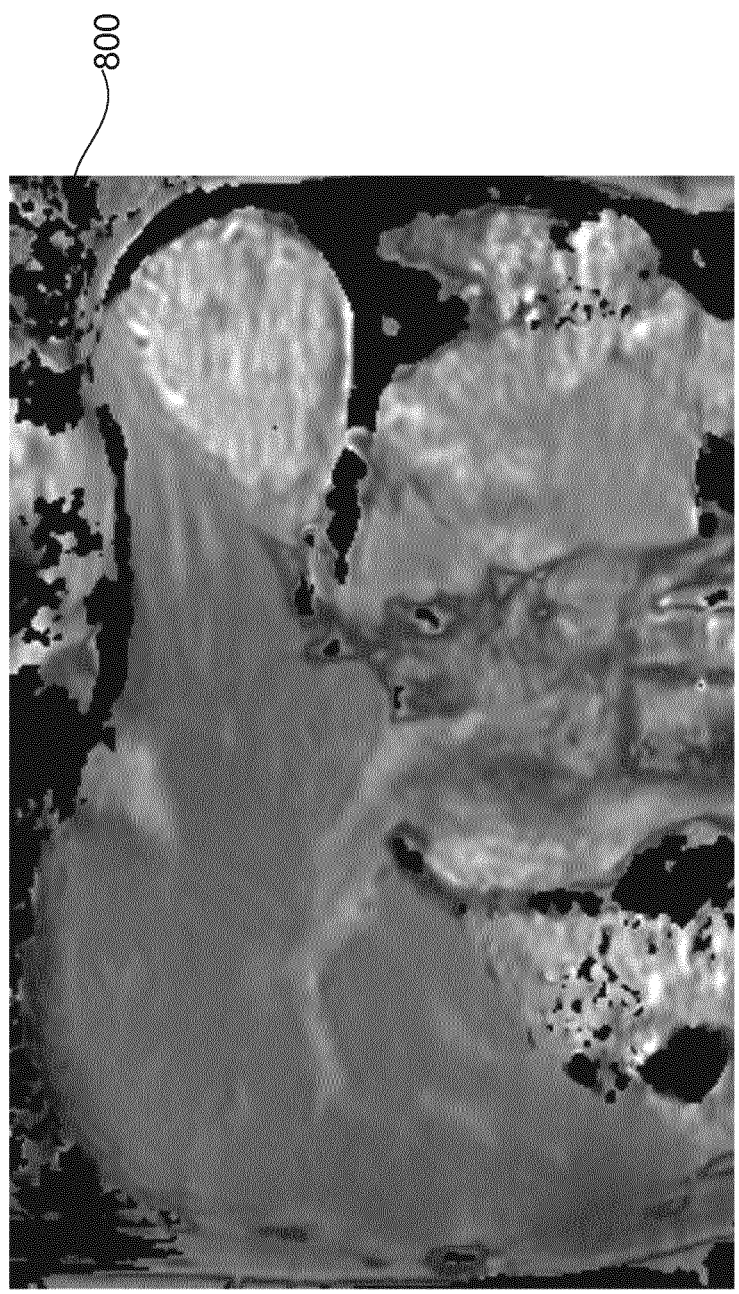
FIG. 8 MRI image of a liver acquired with a magnetization transfer pulse offset from a first frequency of the water resonance.
Figure 9:
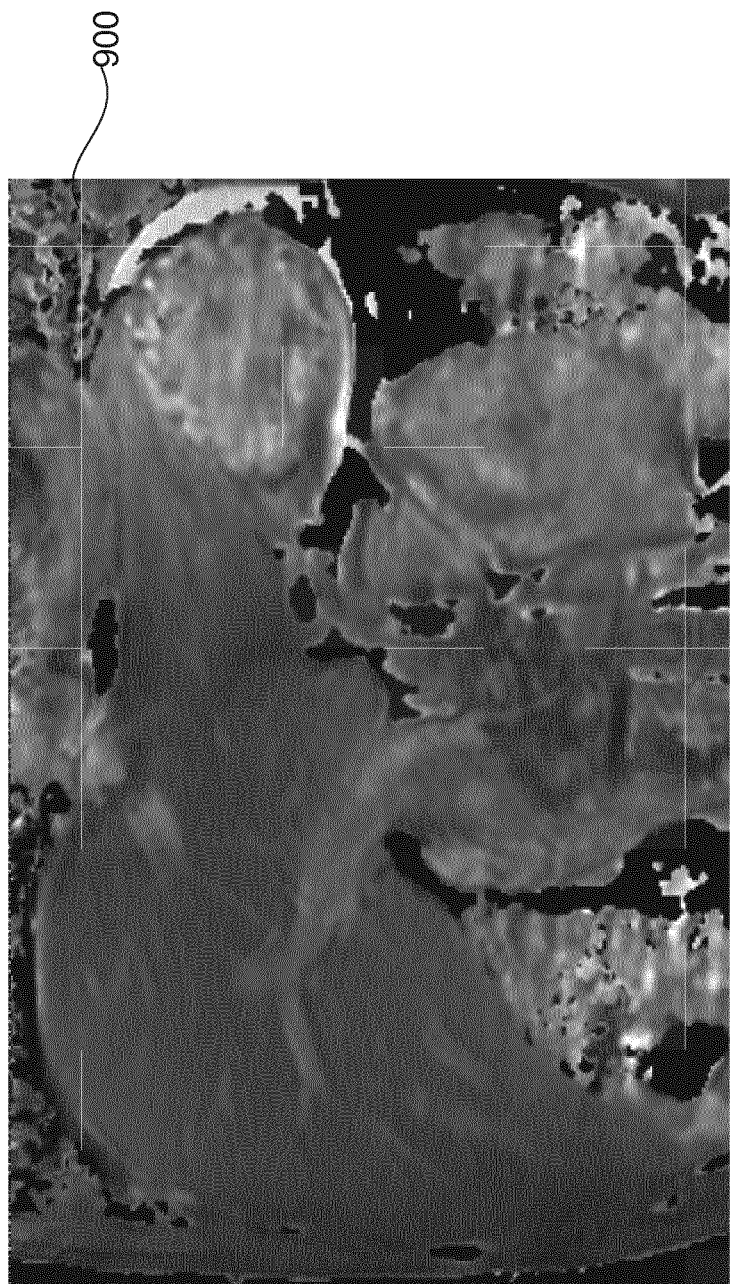
FIG. 9. MRI image of the liver of FIG. 8 acquired with a magnetization transfer pulse offset from a second frequency of the water resonance.
Figure 10:
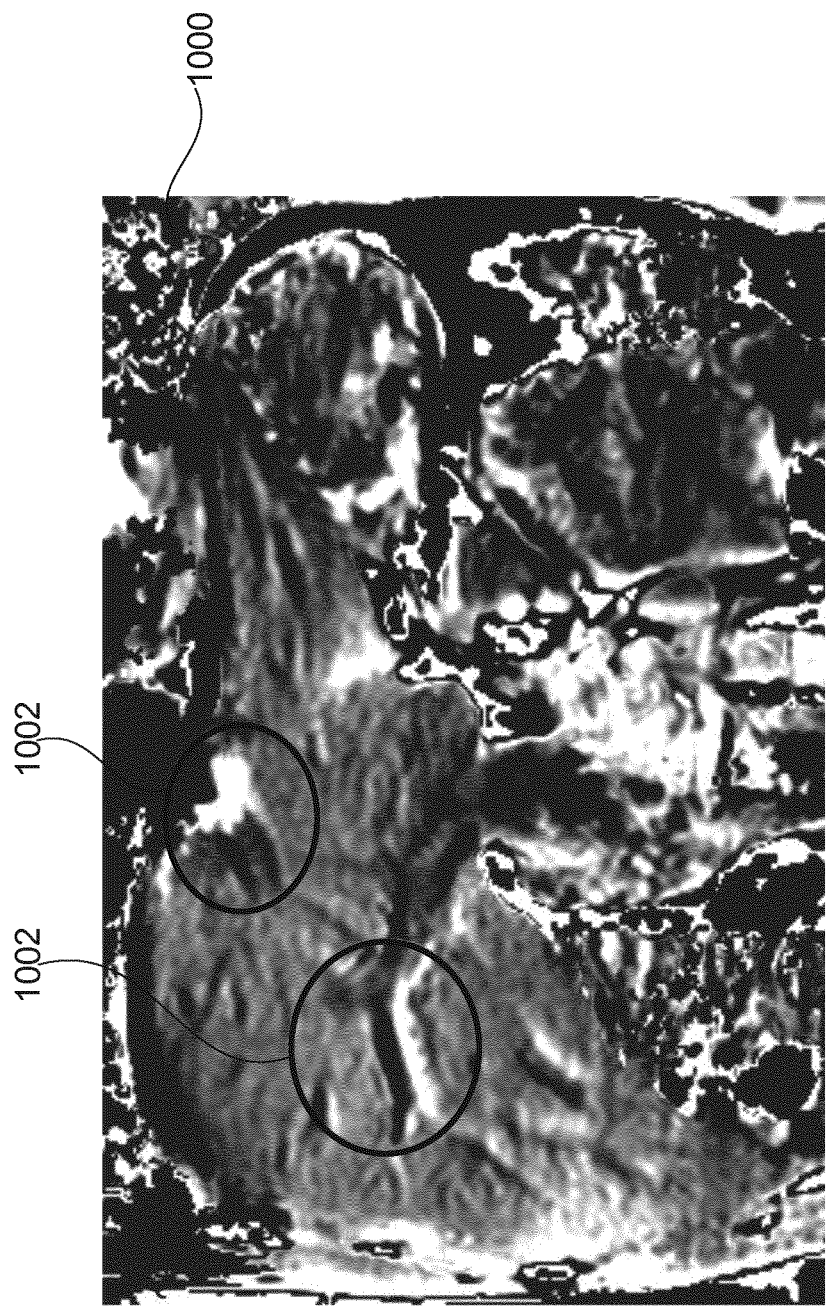
FIG. 10 shows an image constructed by dividing pixels of FIG. 8 by corresponding voxels of FIG. 9.
Figure 11:
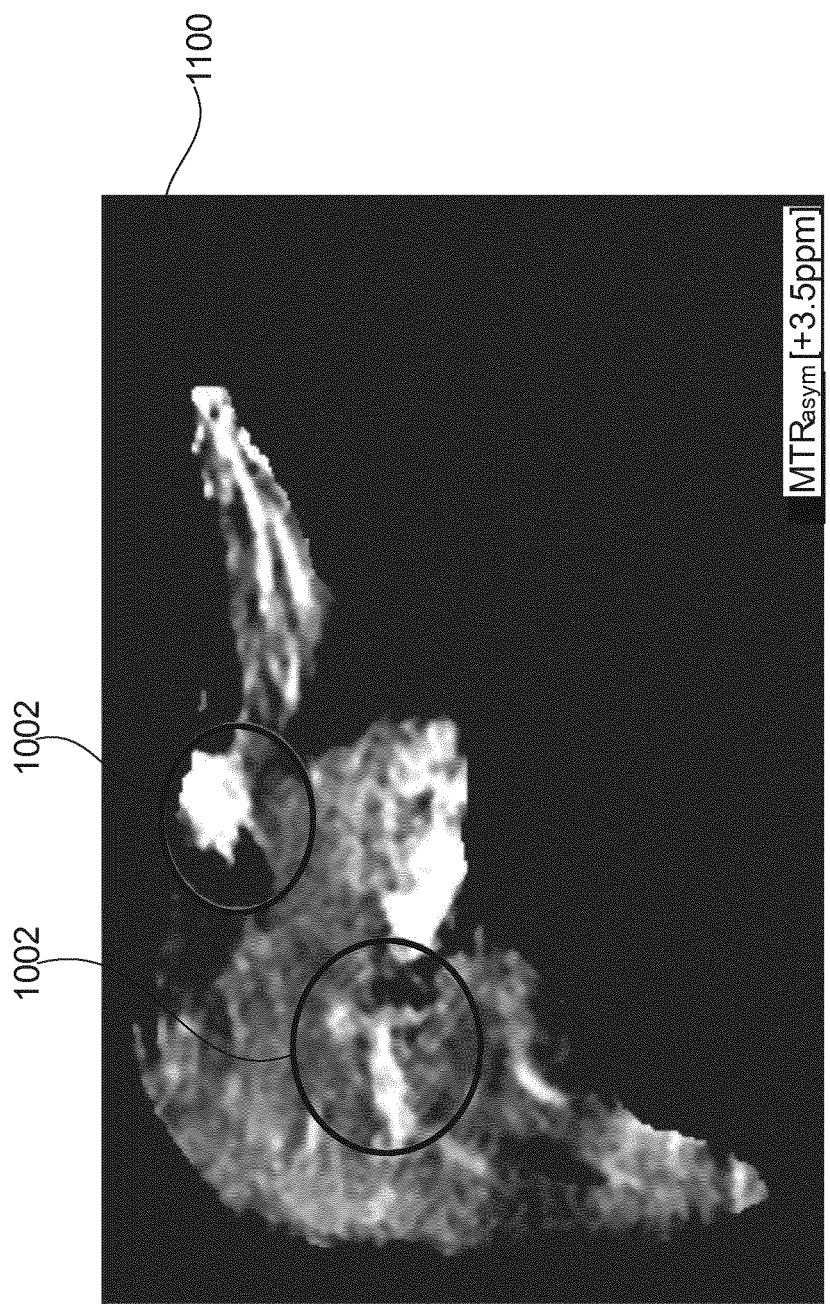
FIG. 11 shows the results of an asymmetry analysis of the liver of FIG. 8 with B0 field correction.

FIGS. 8-13 are used to illustrate an example of masking inconsistent Z-spectral data in CEST. FIG. 8 shows an MRI image of a liver acquired with a magnetization transfer pulse offset from a first frequency $S[\omega_1]$ of the water resonance. All the FIGS. 8-13 show the same region of interest of the liver. FIG. 9 shows the Z-spectral data at a second offset $S[\omega_2]$ from the water resonance. The offsets in FIGS. 8 and 9 are at adjacent locations within the Z-spectra. Image 8 is closer to the water resonance than the image 900 in FIG. 9. FIG. 10 shows the quotient by voxel of the image in FIG. 8 divided by 800 by the image 900 in FIG. 9. This results in image 1000 which shows the ratio of $S[\omega_1]$ to $S[\omega_2]$. There are two regions 1002 that likely contain motion corruption. FIG. 11 shows an image 1100 which is the result of an asymmetry analysis with B0 field correction at a $\Delta\omega=+3.5$ ppm. The corrupted regions 1002 are clearly visible in the image at 1100.

Figure 12:
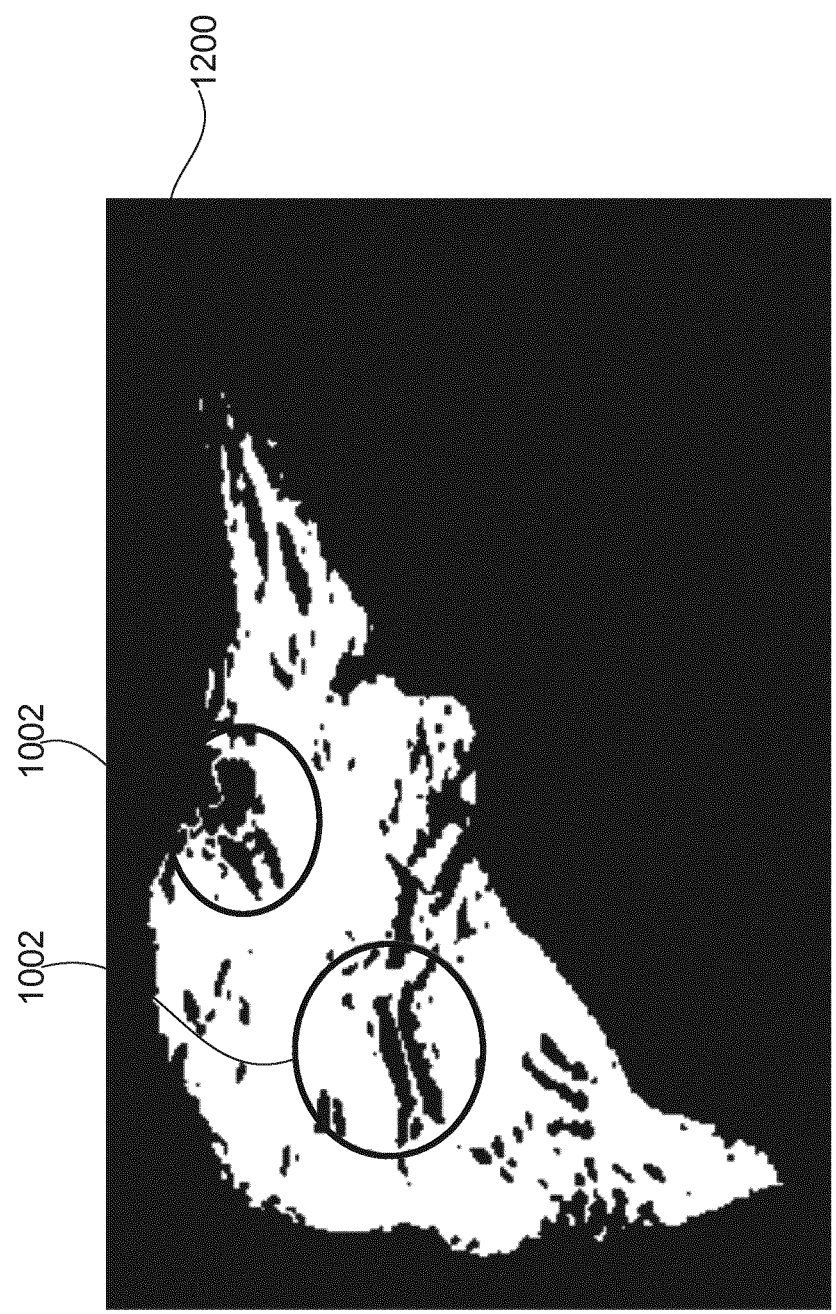
FIG. 12 shows a mask for the liver of FIG. 8 based on Z-spectral consistency at the first and second frequencies.
Figure 13:
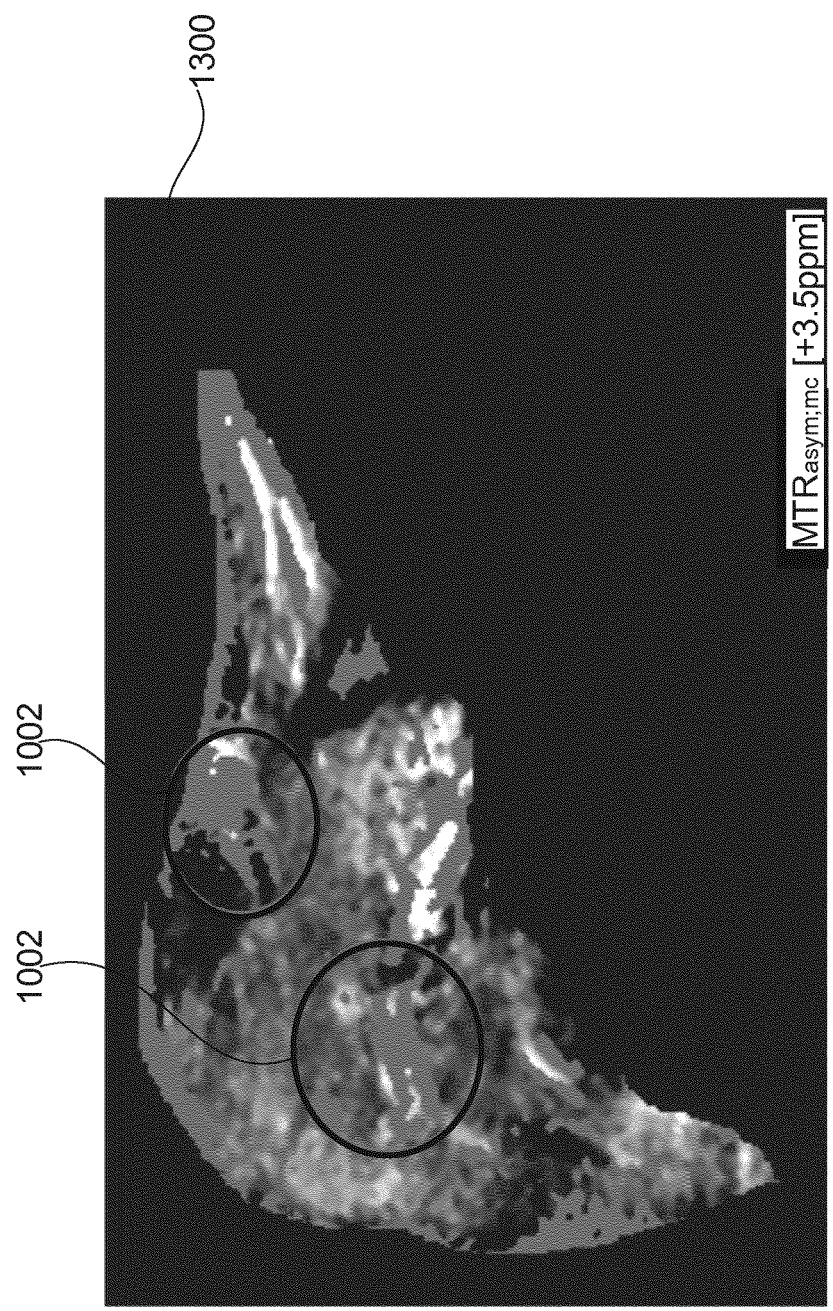
FIG. 13 shows the application of the mask of FIG. 12 to the asymmetry analysis of FIG. 11.

FIG. 12 shows a mask 1200 which was constructed using the Z-spectrum consistency of the ratio at $S[\omega_1]$ to $S[\omega_2]$. FIG. 13 shows the result of applying the mask 1200 of FIG. 12 to the image 1200 of FIG. 12. The values in the mask have been set to a predetermined value. It can be seen that this mostly eliminates the artifacts in the regions 1002.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 medical imaging system
102 computer
104 processor
106 hardware interface
108 user interface
110 computer memory
120 machine executable instructions
122 magnetic resonance image data
124 predetermined criteria
126 motion likelihood map
128 CEST magnetic resonance image
200 receive magnetic resonance image data acquired according to a CEST magnetic resonance imaging protocol
202 assign a motion likelihood map to each voxel by comparing the measured Z-spectrum of each voxel to predetermined criteria
204 reconstruct a CEST magnetic resonance image using the magnetic resonance image data and the motion likelihood map
300 medical imaging system
302 magnetic resonance imaging system
304 magnet
306 bore of magnet
308 imaging zone
309 region of interest
310 magnetic field gradient coils
312 magnetic field gradient coil power supply
314 radio-frequency coil
316 transceiver
318 subject
320 subject support
321 pulse sequence commands
322 magnetic resonance k-space data
324 curve
326 error function
328 Z-spectrum dictionary
330 set of weights
332 residual
400 receive magnetic resonance k-space data
402 reconstruct the magnetic resonance image data using the magnetic resonance k-space data according to the CEST magnetic resonance imaging protocol
500 Z-spectrum
502 Z-spectral point
504 Z-spectral point expected location
504' Z-spectral point expected location
506 Z-spectral point corrupted by motion
506' Z-spectral point corrupted by motion
508 Z-spectral point at affected by CEST effect
510 off resonant Z-spectral point
520 magnitude of signal without magnetization transfer pulse
522 resonance in PPM
524 signal magnitude
526 predetermined criteria
700 model function
702 predefined error margin
704 CEST dip
800 MT image at S[w1]
900 MT image at S[w2]
1000 ratio of S[w1]/S[w2]
1002 area with motion corruption
1100 asymmetry (Morays) analysis
1200 image mask

The invention claimed is:

1. A medical imaging system, comprising:
a memory for storing machine executable instructions;
a processor for controlling the medical imaging system, wherein execution of the machine executable instructions causes the processor to:
receive magnetic resonance image data acquired according to a Chemical Exchange Saturation Transfer (CEST) magnetic resonance imaging protocol, wherein the magnetic resonance image data comprises voxels, wherein each of the voxels comprises a measured Z-spectrum for a set of saturation frequency offsets;
form a motion likelihood map that represents a voxel-wise probability of motion by comparing the measured Z-spectrum of each voxel to predetermined criteria; and reconstruct a CEST magnetic resonance image from the magnetic resonance image data and including correction of motion artefacts on the basis of the motion likelihood map.

2. The medical imaging system of claim 1, wherein execution of the machine executable instructions further causes the processor to fit a curve to at least a sub-set of the measured Z-spectrum for each of the voxels by minimizing an error function, wherein the motion likelihood map is dependent upon the minimized error function for each of the voxels.

3. The medical imaging system of claim 2, wherein the saturation frequency offsets of the measured Z-spectrum within a predetermined chemical-shift distance of predetermined proton pools for saturation transfer are excluded from the fitting of the measured Z-spectrum.

4. The medical imaging system of claim 1, wherein the memory contains a Z-spectrum dictionary comprising multiple Z-spectra, wherein execution of the machine executable instructions further causes the processor to construct a fitted Z-spectrum using a linear combination of the multiple Z-spectra by optimizing a set of weights, wherein a motion likelihood map for each voxel is calculated using residual deviations of the measured Z-spectrum from the linear combination of dictionary entries.

5. The medical imaging system of claim 1, wherein the motion likelihood map is constructed by comparing the measured Z-spectrum for one or more of the frequency offsets to the predetermined criteria.

6. The medical imaging system of claim 5 wherein the predetermined criteria are any one of the following:
an absolute range of Z-spectral signals of the measured Z-spectrum in percent of an unsaturated Z-spectral signal of the measured Z-spectrum;
a relative range in comparison of the Z-spectral signals to adjacent Z-spectral signals of the measured Z-spectrum;
a monotonically increasing value for adjacent Z-spectral signal value of the measured Z-spectrum as an absolute distance of frequency offset from 0 ppm increases; and
a Z-spectral signal is found outside a predefined error margin in relation to a model function.

7. The medical imaging system of claim 1, wherein execution of the machine executable instructions further causes the processor to scale voxels of the CEST magnetic resonance image using the likelihood map.

8. The medical imaging system of claim 1, wherein execution of the machine executable instructions further causes the processor to:
construct an image mask by thresholding the motion likelihood map; and
modify the CEST magnetic resonance image by setting its voxels to a predetermined value using the image mask.

9. The medical imaging system of claim 1, wherein execution of the machine executable instructions further causes the processor to:
render the CEST magnetic resonance image on a display, and
render the motion likelihood map adjacent to the CEST magnetic resonance image or superimposed upon the CEST magnetic resonance image on the display.

10. The medical imaging system of claim 1, wherein execution of the machine executable instructions further causes the processor to:
receive magnetic resonance k-space data; and
reconstruct the magnetic resonance image data using the magnetic resonance k-space data according to the CEST magnetic resonance imaging protocol.

11. The medical imaging system of claim 10, wherein the medical imaging system further comprises a magnetic resonance imaging system configured for acquiring the magnetic resonance k-space data from a subject within an imaging zone, wherein the memory further stores pulse sequence commands, wherein the pulse sequence commands are configured to acquire the magnetic resonance data according to the CEST magnetic resonance imaging protocol, wherein execution of the machine executable instructions cause the processor to control the magnetic resonance imaging system with the pulse sequence commands to acquire the magnetic resonance k-space data.

12. The medical imaging system of claim 1, wherein the motion artefacts are produced at least in part by respiratory motion.

13. A computer program product comprising a tangible non-volatile medium having stored thereon machine executable instructions for execution by a processor controlling a medical imaging system,
wherein execution of the machine executable instructions causes the processor to:
receive magnetic resonance image data acquired according to a CEST magnetic resonance imaging protocol, wherein the magnetic resonance image data comprises voxels, wherein each of the voxels comprises a measured Z-spectrum for a set of saturation frequency offsets;
form a motion likelihood map that represents a voxel-wise probability of motion by comparing the measured Z-spectrum of each voxel to predetermined criteria; and
reconstruct a CEST magnetic resonance image using the magnetic resonance image data and including correction of motion artefacts on the basis of the motion likelihood map.

14. The computer program product of claim 13, wherein the medical imaging system further comprises a magnetic resonance imaging system configured for acquiring the magnetic resonance k-space data from a subject within an imaging zone, wherein the memory further stores pulse sequence commands, wherein the pulse sequence commands are configured to control the magnetic resonance imaging system to acquire the magnetic resonance data according to the CEST magnetic resonance imaging protocol, wherein execution of the machine executable instructions cause the processor to:
control the magnetic resonance imaging system with the pulse sequence commands to acquire the magnetic resonance k-space data; and
reconstruct the magnetic resonance image data using the magnetic resonance k-space data according to the CEST magnetic resonance imaging protocol.

15. The computer program product of claim 13, wherein the motion artefacts are produced at least in part by respiratory motion.

16. A method of operating a medical system, wherein the method comprises:
receiving magnetic resonance image data acquired according to a Chemical Exchange Saturation Transfer (CEST) magnetic resonance imaging protocol, wherein the magnetic resonance image data comprises voxels, wherein each of the voxels comprises a measured Z-spectrum for a set of saturation frequency offsets;

form a motion likelihood map that represents a voxel-wise probability of motion by comparing the measured Z-spectrum of each voxel to predetermined criteria; and reconstructing a CEST magnetic resonance image using the magnetic resonance image data and including correction of motion artefacts on the basis of the motion likelihood map.

17. The method of claim 16, wherein the motion artefacts are produced at least in part by respiratory motion.

18. The method of claim 16, further comprising fitting a curve to at least a sub-set of the measured Z-spectrum for each of the voxels by minimizing an error function, wherein the motion likelihood map is dependent upon the minimized error function for each of the voxels.

19. The method of claim 18, wherein the saturation frequency offsets of the measured Z-spectrum within a predetermined chemical-shift distance of predetermined proton pools for saturation transfer are excluded from the fitting of the measured Z-spectrum.

20. The method of claim 18, wherein forming the motion likelihood map comprises comparing the measured Z-spectrum for one or more of the frequency offsets to the predetermined criteria.

* * * * *